(12) United States Patent
Tomasini et al.

(10) Patent No.: US 12,731,716 B2
(45) Date of Patent: Sep. 8, 2026

(54) ACCESSORY DEVICE FOR LOW-VOLTAGE SWITCHES

(71) Applicant: ABB S.p.A., Milan (IT)

(72) Inventors: Marco Tomasini, Sorisole (IT); Paolo Gallo, Palazzolo Acreide (IT)

(73) Assignee: ABB S.p.A., Milan (IT)

( * ) Notice: Subject to any disclaimer, the term of this patent is extended or adjusted under 35 U.S.C. 154(b) by 167 days.

(21) Appl. No.: 18/535,879

(22) Filed: Dec. 11, 2023

(65) Prior Publication Data

US 2024/0194387 A1 Jun. 13, 2024

(30) Foreign Application Priority Data

Dec. 13, 2022 (EP) .................................... 22213265

(51) Int. Cl.
*H01F 27/24* (2006.01)
*G01R 15/18* (2006.01)
(Continued)

(52) U.S. Cl.
CPC ........... *H01F 27/24* (2013.01); *G01R 15/181* (2013.01); *G01R 19/0092* (2013.01);
(Continued)

(58) Field of Classification Search
CPC ........ H01F 27/24; H01F 27/28; H01F 27/366; H01F 27/36; H01F 38/30; H01F 3/00; G01R 15/181; G01R 19/0092; G01R 1/18; G01R 15/183; G01R 19/0084; H02J 50/001; H02H 1/0007
See application file for complete search history.

(56) References Cited

U.S. PATENT DOCUMENTS 5,045,637 A 9/1991 Sato et al.
5,757,183 A * 5/1998 Smith .................... G01R 33/09 324/252

(Continued)

FOREIGN PATENT DOCUMENTS

CN 110310808 A 10/2019

OTHER PUBLICATIONS

European Extended Search Report, Application No. 22213265.6, dated Apr. 4, 2023, 9 pps.

(Continued)

*Primary Examiner* — Akm Zakaria
(74) *Attorney, Agent, or Firm* — McCarter & English, LLP

(57) ABSTRACT

An accessory device for a low-voltage switch is provided. The accessory device includes a power supply arrangement for providing a power supply to feed an electronic device onboard said switch, said power supply arrangement including a magnetic core, which forms a first magnetic circuit configured to be enchained with a primary winding conductor, and a first secondary winding conductor, which is wound around said magnetic core, and a current detection arrangement for providing detection signals indicative of a current flowing along said primary conductor. The magnetic core of said power supply arrangement and said current detection arrangement are arranged next to each other. Said accessory device includes one or more magnetic shield elements, which are interposed between said magnetic core and said current detection arrangement.

10 Claims, 11 Drawing Sheets

(51) Int. Cl.
*G01R 19/00* (2006.01)
*H01F 27/28* (2006.01)
*H01F 27/36* (2006.01)
*H02J 50/00* (2016.01)

(52) U.S. Cl.
CPC ........... *H01F 27/28* (2013.01); *H01F 27/366* (2020.08); *H02J 50/001* (2020.01)

(56) References Cited

U.S. PATENT DOCUMENTS

2004/0183522 A1* 9/2004 Gunn .................. G01R 15/186 324/126
2004/0257734 A1* 12/2004 Kudo ....................... H02H 3/08 361/93.1
2005/0141159 A1 6/2005 Gamba et al.
2005/0185345 A1* 8/2005 Ding .................... G11B 5/3912
2007/0144754 A1* 6/2007 Donazzi ................... H02G 9/04 174/34
2019/0302151 A1 10/2019 Manikandan et al.
2024/0339417 A1* 10/2024 Katti ..................... H01L 23/552

OTHER PUBLICATIONS

Indian Office Action for Application No. 202344068302, dated Mar. 23, 2026, and 10 pages.

* cited by examiner

ACCESSORY DEVICE FOR LOW-VOLTAGE SWITCHES

CROSS REFERENCE TO RELATED APPLICATIONS

This patent application claims the benefit and priority of European Patent Application No. 22213265.6 filed on Dec. 13, 2022, the disclosure of which is incorporated by reference herein in its entirety as part of the present application.

BACKGROUND

The present disclosure relates to the field of electrical installations, may be operating at low-voltage levels. More particularly, the present disclosure relates to an accessory device for low-voltage switches, which are adapted to measure electrical currents and feed electronic devices incorporated in said low- voltage switches.

As is known, an electrical installation (e.g., an electric grid, an electric switchgear system, an electric switchboard, and the like) normally includes a number of switches (e.g., circuit breakers, disconnectors, contactors, and the like) designed to allow or prevent the flow of electric currents along corresponding electric lines.

Typically, many switches include onboard electronic devices (e.g., the so-called “protection relays”) designed to carry out control functionalities (e.g., controlling the intervention of the switch in the event of faults or overloads) and/or monitoring functionalities (e.g., providing data sets related to measurements of physical quantities). In order to carry out most of their functionalities, these electronic devices need to collect and process detection signals indicative of electric currents flowing along the electric lines of the electrical installation, on which the switches are arranged.

In order to allow the onboard electronic devices to operate, low voltage switches generally incorporate one or more accessory devices configured to measure electric currents along corresponding electric lines and, at the same time, to harvest electric power from said electric lines in order to feed said electronic devices.

Patent document US2005/0141159A1 discloses an example of accessory device of this type, which is designed for a low-voltage unipolar or multipolar circuit breaker.

The accessory device includes a suitable amperometric transformer providing a power supply to feed an electronic protection device on board the circuit breaker. The amperometric transformer is arranged in combination with a current detection device designed to provide detection signals indicative of the current flowing along a conductor. Such a current detection device (which may be configured as a Rogowski coil) is positioned in proximity of the magnetic circuit of the amperometric transformer to obtain an overall compact structure.

Accessory devices of the type disclosed in the above-mentioned patent document provide relevant advantages in terms of performances, structural integration and size reduction. However, they show some drawbacks, in particular for what concerning their current measurement performances.

As a matter of fact, the accuracy of the current measurements carried out by the currently available accessory devices is highly variable with the magnitude of the current flowing along the conductors under detection. In particular, it has been seen that these current measurements are affected by relatively high errors (e.g., about the 0,5%) for current rates relatively far from the foreseen nominal current values.

As it easy to understand, such a circumstance is often unacceptable for the management of modern electrical installations, where high precision measurements of physical quantities are generally required.

BRIEF DESCRIPTION

Embodiments of the present disclosure provide an accessory device for low-voltage switches, which allows the above-mentioned drawbacks to be overcome or mitigated.

An embodiment of the present disclosure provides an accessory device capable of suitably feeding an electronic device installed on board to a switch and, at the same time, capable of ensuring high-level performances in measuring the current flowing along an electrical conductor included in or operatively associated to the switch.

Another embodiment of the present disclosure provides an accessory device, which has a relatively simple and compact structure and can be manufactured industrially at competitive costs.

In order to fulfill this aim, the present disclosure provides an accessory device, according to the following claim 1 and the related dependent claims.

In a general definition, the accessory device of the disclosure includes, in combination, a power supply arrangement adapted to provide a power supply to feed an electronic device on board a switch and a current detection arrangement adapted to measure electrical currents along a conductor associated thereto.

The power supply arrangement includes a magnetic core, which forms a first magnetic circuit configured to be enchained with a primary winding conductor, and a first secondary winding conductor, which is wound around said magnetic core.

The current detection arrangement is adapted to provide detection signals indicative of a current flowing along the aforesaid primary conductor.

The current detection arrangement may provide said detection signals to the aforesaid electronic device on board the switch.

The magnetic core of the power supply arrangement and the current detection arrangement are arranged next to each other.

According to the disclosure, the accessory device includes one or more magnetic shield elements interposed, at least partially, between the magnetic core of the power supply arrangement and the current detection arrangement.

According to an aspect of the disclosure, the aforesaid current detection arrangement includes a non-magnetic core, which forms a second magnetic circuit configured to be enchained with said primary winding conductor, and at least a second secondary winding conductor, which is wound around said non-magnetic core.

The magnetic core of the power supply arrangement and the non-magnetic core of the current detection arrangement may be arranged next to each other.

According to this aspect of the disclosure, the above-mentioned one or more magnetic shield elements are interposed, at least partially, between said magnetic core and said non-magnetic core.

The magnetic core of the power supply arrangement and the non-magnetic core of the current detection arrangement may include respectively a first portion of magnetic core and a second portion of non-magnetic core, which are arranged next to each other. In this case, the above-mentioned one or more magnetic shield elements are interposed, at least partially, between said first portion of magnetic core and said second portion of non-magnetic core.

The first portion of the magnetic core of the power supply arrangement and the second portion of the non-magnetic core of the current detection arrangement may have matching shapes. More, they may be shaped as ring portions with a same radius of curvature.

According to an embodiment of the disclosure, the accessory device includes a single magnetic shield element made of magnetic material.

Said single magnetic shield element is interposed, at least partially, between the magnetic core of said power supply arrangement and said current detection arrangement (may be the non-magnetic core of said current detection arrangement).

Said single magnetic shield element may be made of ferromagnetic material.

According to an embodiment of the disclosure, the accessory device includes a pair of magnetic shield elements arranged next to each other and interposed, at least partially, between the magnetic core of said power supply arrangement and said current detection arrangement (may be the non-magnetic core of said current detection arrangement).

In particular, a first magnetic shield element made of non-magnetic material is arranged in proximal position to the magnetic core of the power supply arrangement and a second magnetic shield element made of magnetic material is arranged in proximal position to the current detection arrangement (may be to the non-magnetic core of said current detection arrangement).

Said first magnetic shield element may be made of plastic or silicone material while said second magnetic shield element may be made of ferromagnetic material.

According to an embodiment of the disclosure, the accessory device includes three magnetic shield elements arranged next to each other and interposed, at least partially, between the magnetic core of the power supply arrangement and the current detection arrangement (may be the non-magnetic core of said current detection arrangement).

In particular, a third magnetic shield element and a fourth magnetic shield element both made of magnetic material are arranged in proximal position respectively to the magnetic core of the power supply arrangement and to the current detection arrangement (may be to the non-magnetic core of said current detection arrangement). A fifth magnetic shield element made of non-magnetic material is interposed, at least partially, between said third and fourth magnetic shield elements.

Said third and fourth magnetic shield elements may be made of ferromagnetic material while said fifth magnetic shield element may be made of plastic or silicone material.

Said one or more magnetic shield elements may have shapes partially matching with the shape the first portion of the magnetic core of the power supply arrangement and the shape of the second portion of the non-magnetic core of the current detection arrangement.

Said one or more magnetic shield elements may have a ring shape, more may be ring shapes having the same radius of curvature of the first portion of the magnetic core of the power supply arrangement and the shape of the second portion of the non-magnetic core of the current detection arrangement.

BRIEF DESCRIPTION OF THE DRAWINGS

For a better understanding of the present disclosure, reference is made to the accompanying drawings and to the detailed description hereinafter, in which example but non-limitative embodiments of the differential pressure transmitter according to the present disclosure are illustrated. In the drawings.

DETAILED DESCRIPTION

With reference to the aforesaid figures, the present disclosure relates to an accessory device 1 particularly adapted for use in low-voltage electrical installations, e.g., electric grids, electric switchgear systems, electric switchboards, and the like.

For the purposes of the present disclosure, the term "low voltage" (LV) relates to operating voltages generally lower than 2 kV AC and 2.5 kV DC.

In general terms, the accessory device 1 is operatively couplable to a conductor 150 and it is configured to harvest electric power from such an electric conductor to provide a suitable power supply for an electronic device 110 installed on board a switch 100 of an electrical installation. In addition, the accessory device 1 is configured to provide detection signals indicative of the current flowing along the conductor 150.

The switch 100 may be a circuit-breaker, a contactor, a disconnector, and the like, while the electronic device 110 may be a solenoid, a protection relay, an IED (Intelligent Electronic Device), and the like.

The conductor 150 may be any conductor included in or operatively associated to the switch 100, e.g., a phase conductor of the switch.

The accessory device 1 is particularly adapted for installation on-board the switch 100.

Figure 1:
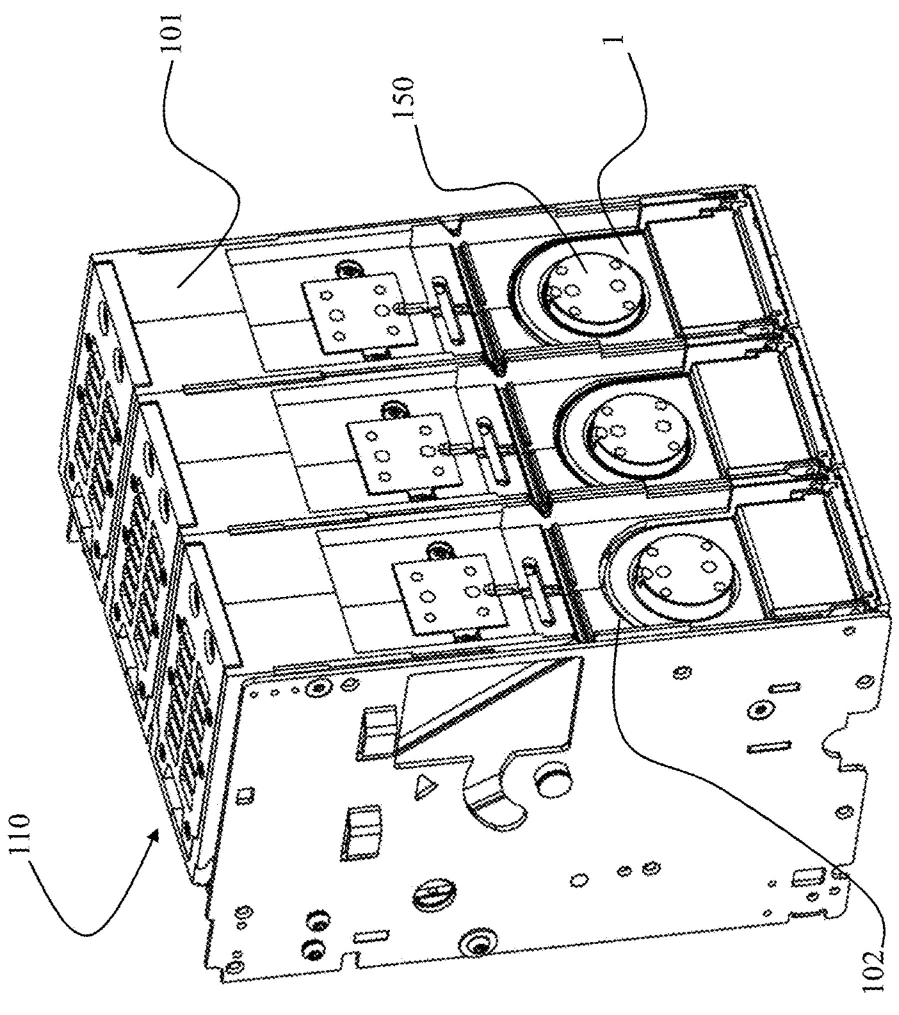
FIG. 1 schematically shows a low-voltage switch incorporating an accessory device, according to the disclosure, for each electric phase.
Figure 1:
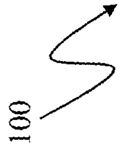

FIG. 1 schematically shows a low-voltage circuit breaker 100 incorporating an accessory device 1 for each electric phase.

As it is possible to notice, each accessory device 1 is accommodated in a corresponding seat 102 of the outer casing 101 of the circuit breaker and, in operation, it is operatively coupled to a phase conductor 150 of the circuit breaker.

As mentioned above, each accessory device 1 is configured to provide a suitable power supply to feed a corresponding protection relay 110 installed on board the circuit breaker 100. In addition, each accessory device 1 is configured to provide the corresponding protection relay 110 with detection signals indicative of the current flowing along the corresponding phase conductor 150.

According to some embodiments of the disclosure, however, the accessory device 1 may be distinct from the switch 100 operatively associated thereto and it may be arranged as a stand-alone device or be mounted on other supporting structures.

Figure 2:
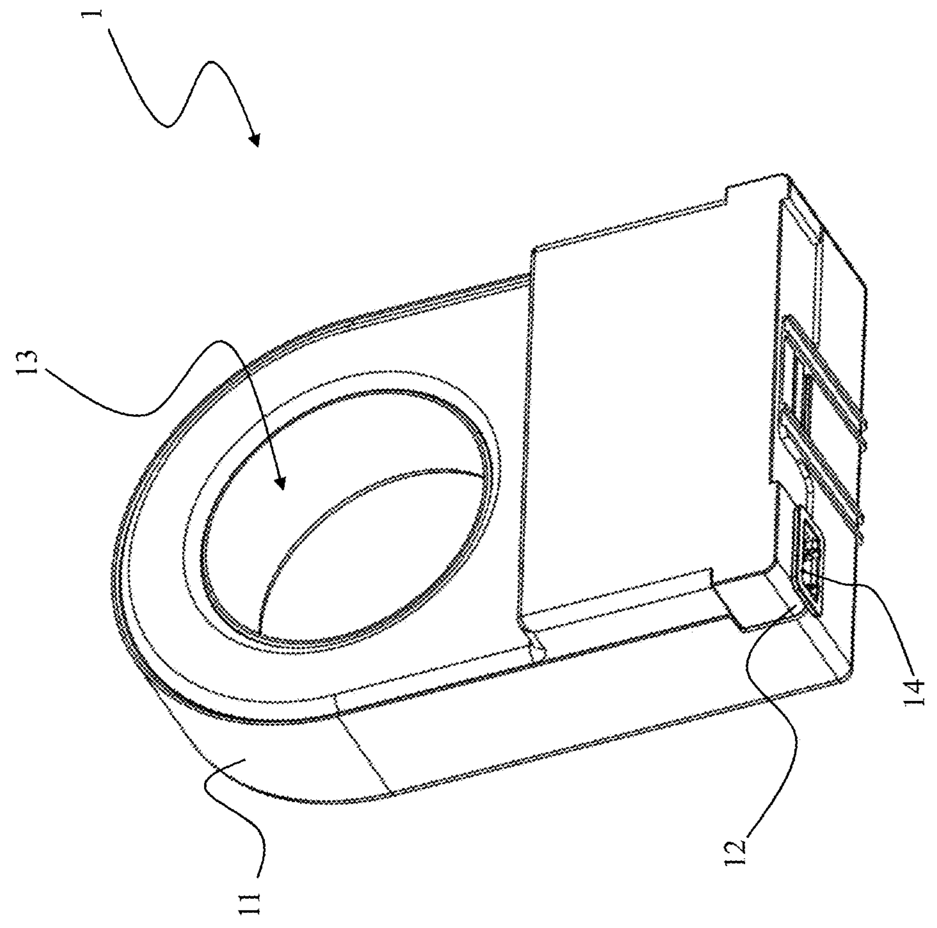
FIG. 2 schematically shows an outer view of the accessory device, according to the disclosure.
Figure 3:
FIGS. 3 and 4 schematically show partial views of first embodiment of the accessory device, according to the disclosure.
Figure 3:
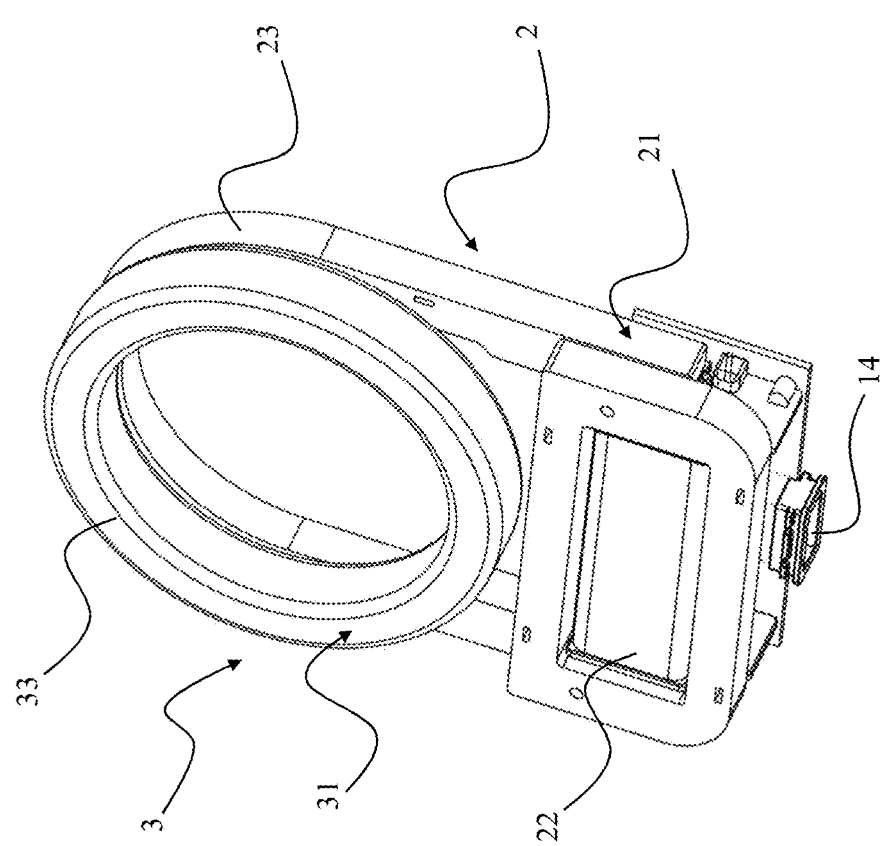
Figure 4:
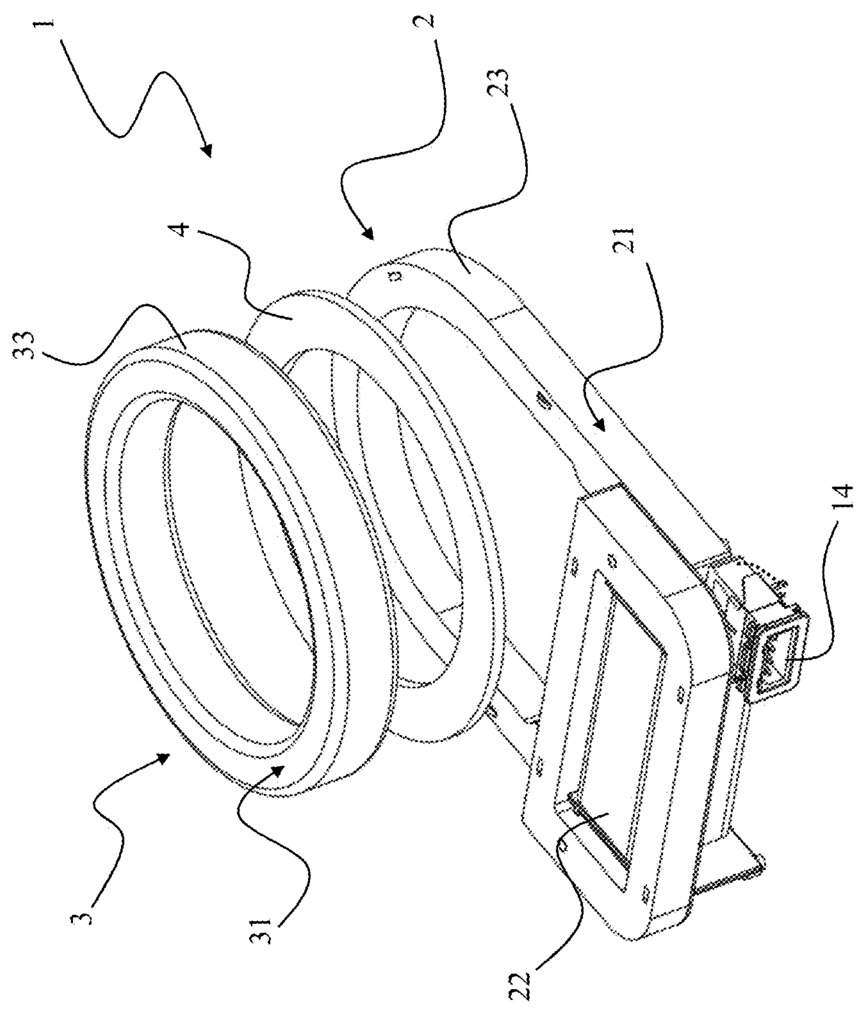
Figure 5:
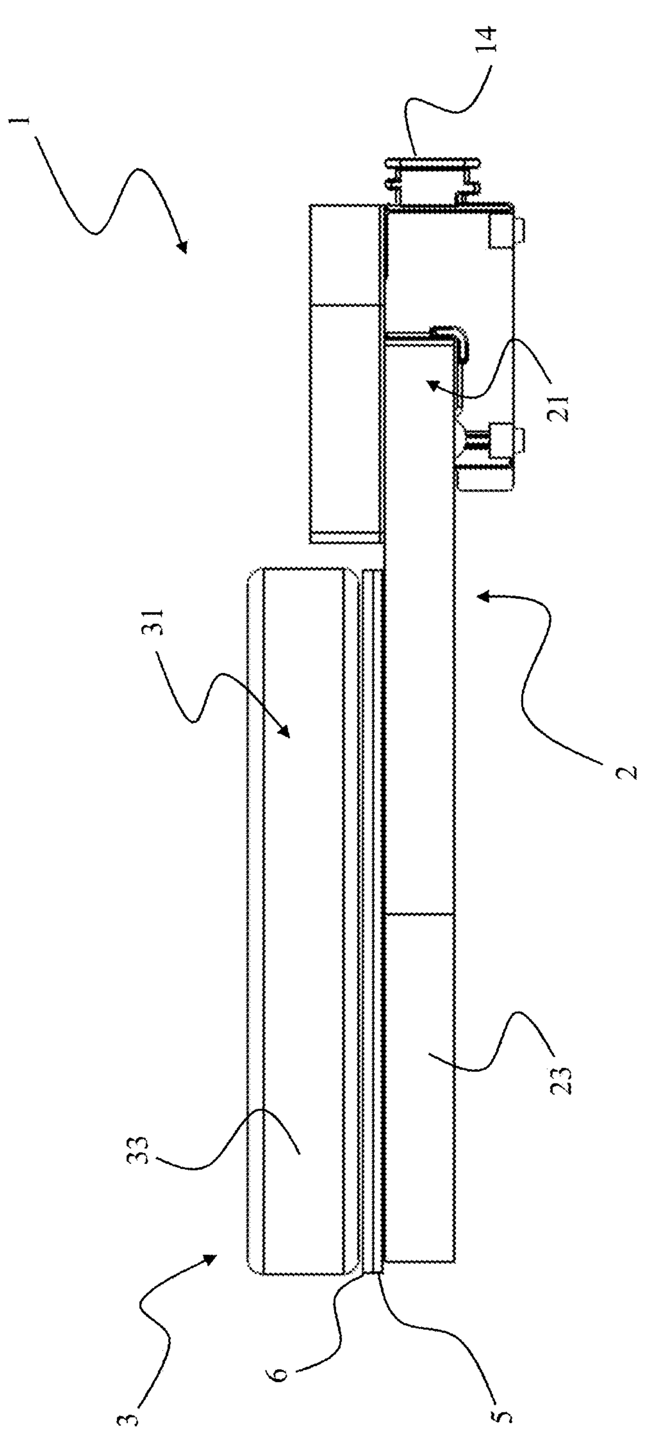
FIGS. 5-7 schematically show partial views of second embodiment of the accessory device, according to the disclosure.

FIG. 2 schematically shows an outer view of the accessory device 1.

The accessory device 1 may include an outer casing 11 conveniently made of an electrically insulating material.

The outer casing 11 may include a pass-through hole 13 for the passage of the electric conductor 150 (FIG. 1) intended to be operatively coupled to the accessory device.

The outer casing 11 further includes an additional aperture 12, at which an output port 14 of the accessory device 1 is arranged. Conveniently the output port 14 includes first output pins (not shown) to output the above-mentioned power supply and second output pins (not shown) to output the above-mentioned detection signals.

The outer casing 11 may be made up of two half-parts, which can be coupled to one another through suitable fitting means. As an alternative, the outer casing 11 may be co-molded with some components of the accessory device.

Referring now to FIGS. 3-10, the accessory device 1 includes a power supply arrangement 2 electrically connected to the electronic device 110 and adapted to feed said electronic device.

Figure 6:
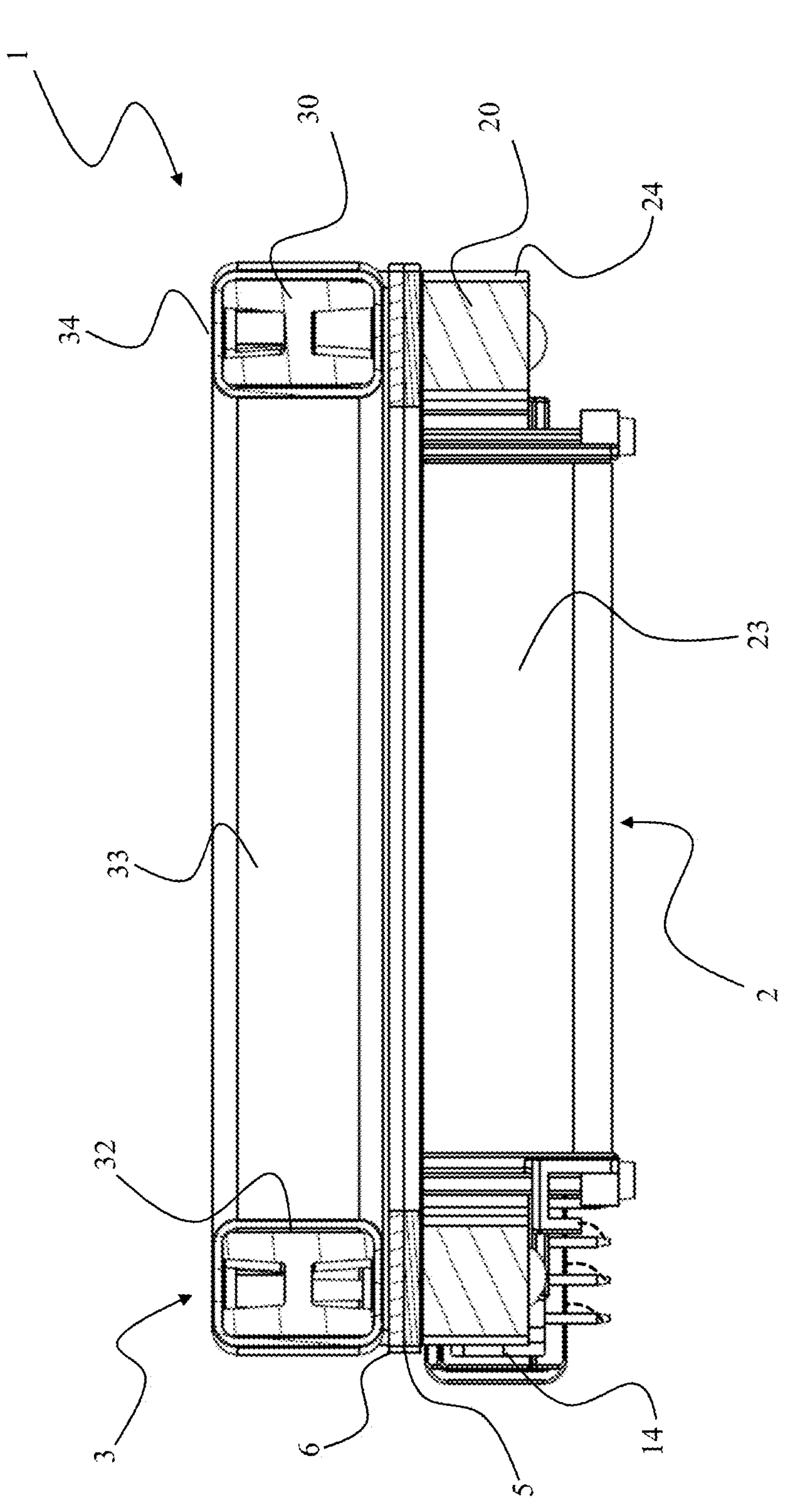
Figure 7:
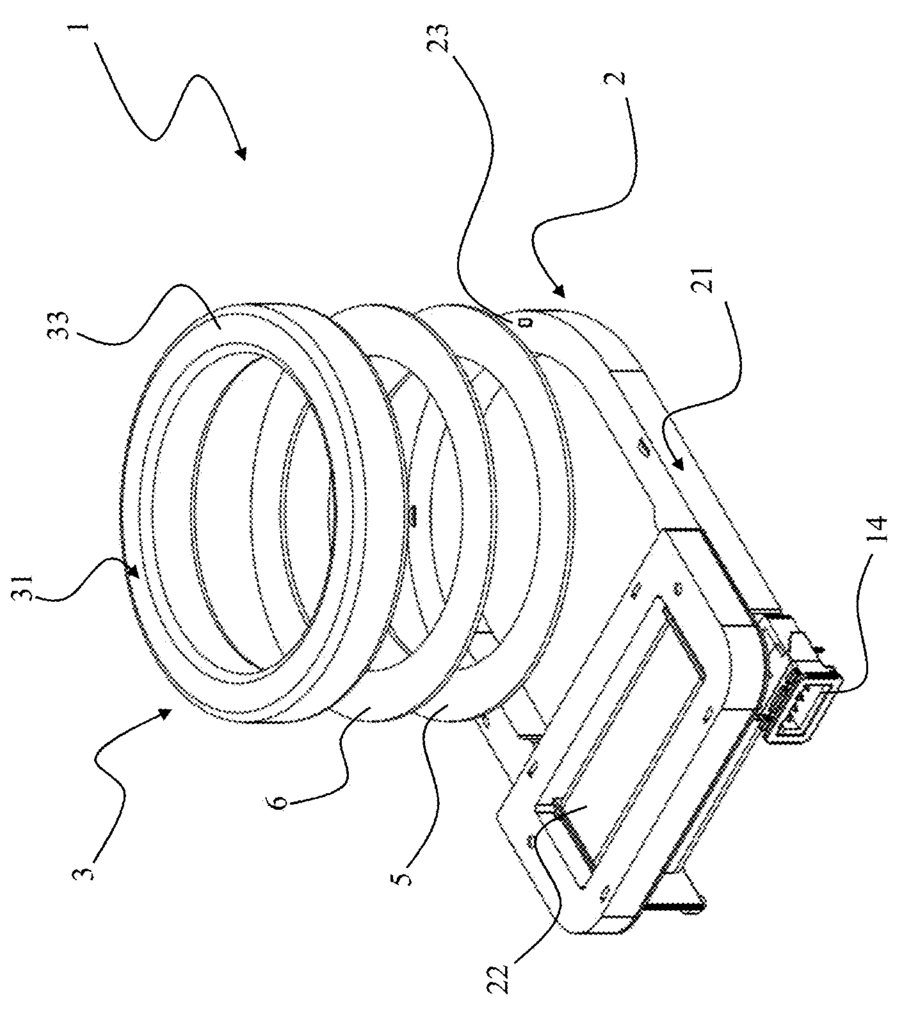
Figure 8:
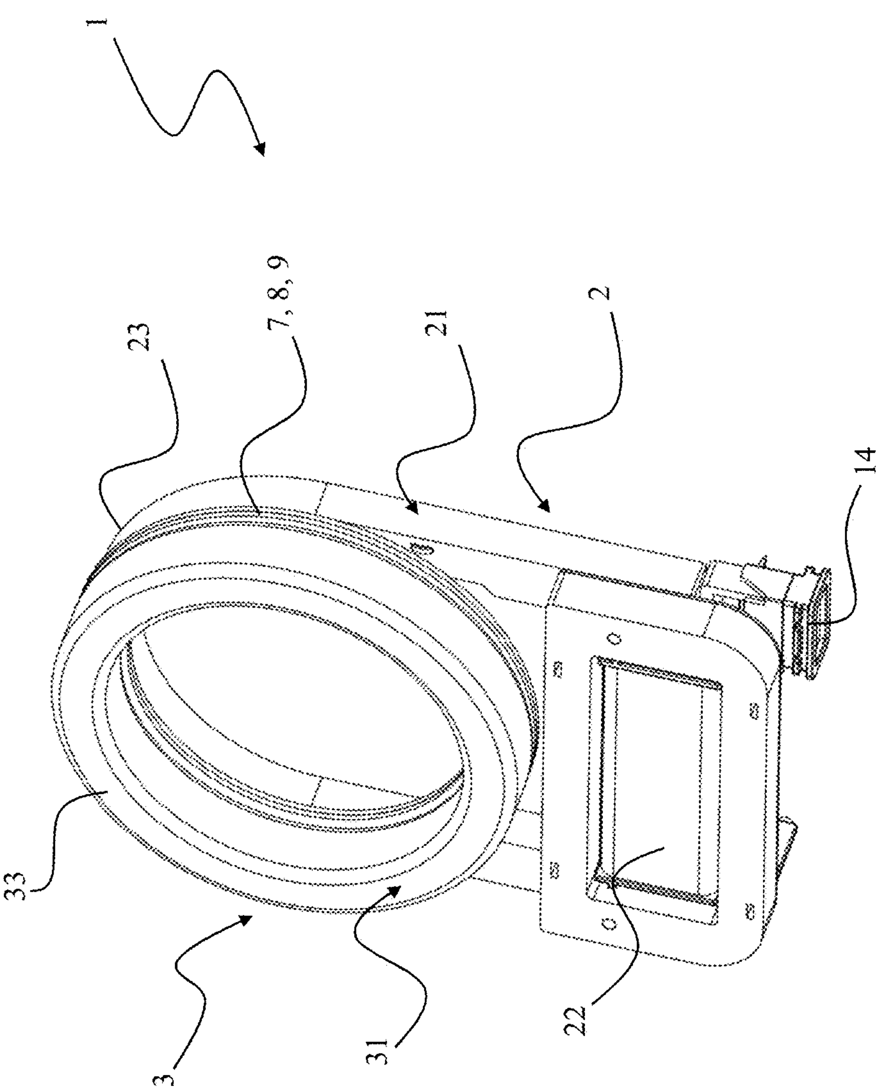
FIGS. 8-10 schematically show partial views of third embodiment of the accessory device, according to the disclosure.
Figure 9:
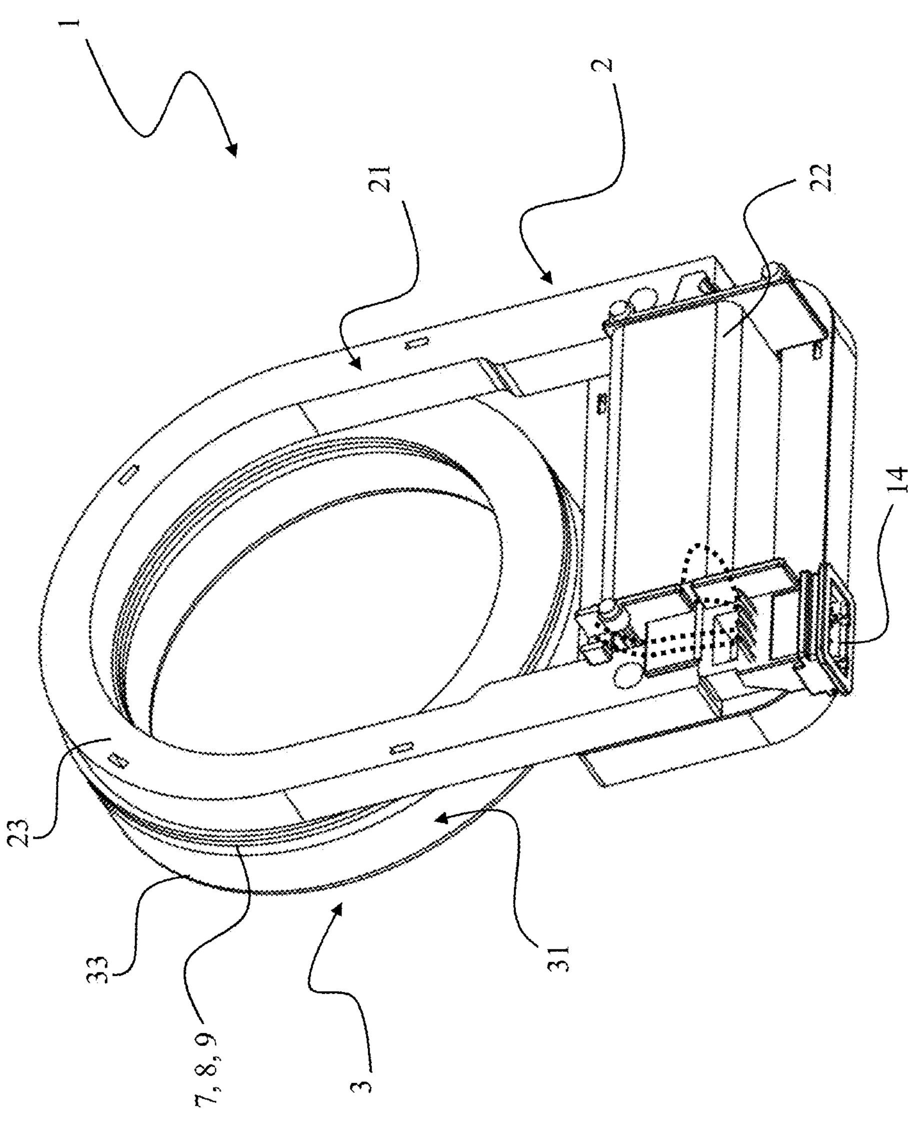
Figure 10:
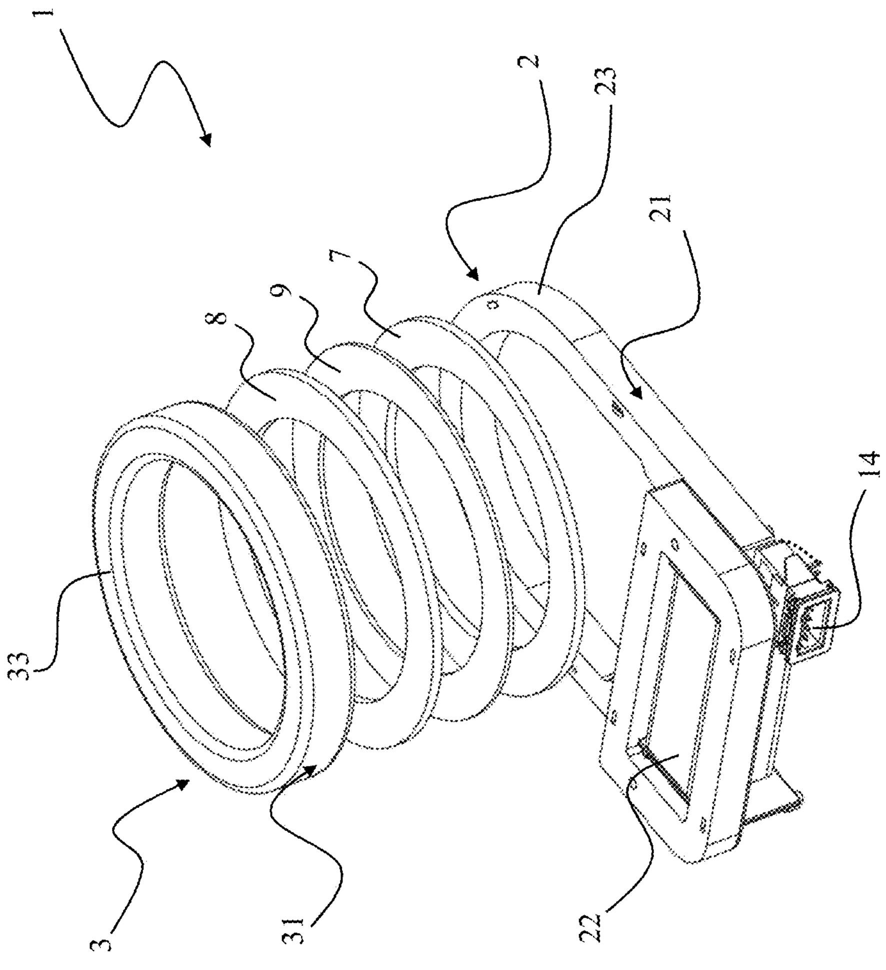

The power supply arrangement 2 includes a magnetic core 20 conveniently made of a ferromagnetic material (FIG. 6).

The magnetic core 20 forms a first magnetic circuit 21 configured to surround at least partially a primary winding conductor 150 (FIG. 1—not shown in FIGS. 3-10) in such a way to be enchained with this latter.

For the sake of clarity, it is specified that, for the purposes of the present disclosure, the term "magnetic circuit" has to be intended as a geometric path along which a magnetic flux (generated by a current flowing along the primary winding conductor 150) is induced to flow.

The first magnetic circuit 21 may be configured to develop substantially along a first reference plane perpendicular to the primary winding conductor 150.

The first magnetic circuit 21 may be configured to form a closed loop around the primary winding conductor 150.

Normally, the primary winding conductor 150 is not part of the accessory device 1. As illustrated above, the primary winding conductor 150 may be formed by the electric conductor (e.g., a phase conductor) included in or operatively associated to the switch 100.

According to some embodiments of the disclosure (not shown), however, the above-mentioned primary winding conductor may be a piece of conductor fixed to the outer casing 11 of the accessory device 1 and electrically connectable in series to a conductor included in or operatively associated to the switch 100.

The power supply arrangement 2 additionally includes a first secondary winding conductor 22 wound around the magnetic core 20.

The first secondary winding conductor 22 may be at a suitable winding portion (not shown) of the magnetic core 20.

Conveniently, the first secondary winding conductor 22 has first winding terminals (not shown) electrically connected to the above-mentioned first output terminals (not shown) of the output port 14.

As it is possible to notice, the first power supply arrangement is basically configured as an amperometric transformer.

When a current flows along the primary winding conductor 150, electric signals (namely current signals) are generated at the first winding terminals of the first secondary winding conductor 22. Such electric signals are made available to the output port 14 and form a power supply suitable for feeding the electronic device 110.

In general, the power supply arrangement 2 may be realized at industrial level according to solutions of known type. For this reason, hereinafter, it will be described only in relation to the aspects of interest of the present disclosure, for the sake of brevity.

According to the disclosure, the accessory device 1 includes a current detection arrangement 3 in combination with the above-illustrated power supply arrangement 2.

The current detection arrangement 3 is adapted to provide detection signals indicative of a current flowing along the primary conductor 150.

The current detection arrangement 3 may be electrically connected to the electronic device 110 and may provide such detection signals directly to said electronic device.

The current detection arrangement 3 is arranged next to the magnetic core 20 at least along a first portion 23 of this latter, which is configured to surround at least partially the primary winding conductor 150.

According to the embodiments of the disclosure shown in the cited figures, the current detection arrangement 3 includes a non-magnetic core 30 forming a second magnetic circuit 31 configured to be enchained with the primary winding conductor 150.

The second magnetic circuit 31 may be configured to develop substantially along a second reference plane perpendicular to the primary winding conductor 150.

The second magnetic circuit 31 may be configured to form a closed loop around the primary winding conductor 150.

The current detection arrangement 3 additionally includes a second secondary winding conductor 32 wound around the non-magnetic core 30 (FIG. 6).

The second secondary winding conductor 32 may be distributed along most of the length of the non-magnetic core 30.

Conveniently, the second secondary winding conductor 32 has second winding terminals (not shown) electrically connected to the above-mentioned second output terminals (not shown) of the output port 14.

As it is possible to notice, according to these embodiments of the disclosure, the current detection arrangement 3 is basically configured as a Rogowski coil. When a current flows along the primary winding conductor 150, electric signals (namely current signals) are generated at the second winding terminals of the second secondary winding conductor 32. Such electric signals are made available to the output port 14 and form detection signals indicative of the current flowing along the primary winding conductor 150

According to the above-mentioned embodiments of the disclosure, the magnetic core 20 and the non-magnetic core 30 are arranged next each other.

More precisely, the magnetic core 20 and the non-magnetic core 30 include respectively at least a first portion 23 and a second portion 33 arranged next to each other, may be along parallel reference planes.

Conveniently, both the first portion 23 of magnetic core and the second portion 33 of non-magnetic core are configured to surround partially the primary conductor 150.

The first portion 23 of magnetic core and the second portion 33 of non-magnetic core may be arranged one upon the other, in mutual neighboring positions.

The first portion 23 of magnetic core and the second portion 33 of non-magnetic core may have matching shapes. May be, they are configured as ring portions having approximately a same radius of curvature.

According to these embodiments of the disclosure, the current detection arrangement 3 includes a casing 34 made of electrically insulating material (FIG. 6) and enclosing, at least partially, the non-magnetic core 30 and the second secondary winding conductor 32.

According to other embodiments of the disclosure (not shown in the cited figures), the current detection arrangement 3 may instead include one or more Hall sensors and positioned in proximity of the magnetic core 20 of the power supply arrangement 2, at least along the first portion 23 of said magnetic core. These Hall sensors may be arranged on a suitable insulating support and enclosed by a suitable protection casing.

In general, the current detection arrangement 3 may be realized at industrial level according to solutions of known type. For this reason, hereinafter, it will be described only in relation to the aspects of interest of the present disclosure, for the sake of brevity.

According to the disclosure, the accessory device 1 includes one or more magnetic shield elements 4, 5, 6, 7, 8, 9 interposed, at least partially, between the magnetic core 20 of the power supply arrangement 2 and the current detection arrangement 3.

When the current detection arrangement 3 includes a non-magnetic core 30, the one or more magnetic shield elements 4, 5, 6, 7, 8, 9 may be interposed, at least partially, between the magnetic core 20 and the non-magnetic core 30.

The one or more magnetic shield elements 4, 5, 6, 7, 8, 9 may be interposed, at least partially, between the first portion 23 of magnetic core and the second portion 33 of non-magnetic core.

EMBODIMENT #1

According to an embodiment of the disclosure (FIGS. 3 and 4), the accessory device 1 includes a single magnetic shield element 4 made of magnetic material, may be ferromagnetic material.

The magnetic shield element 4 extends along a corresponding reference plane parallel to the extension planes of the magnetic core 20 and the non- magnetic core 30.

The magnetic shield element 4 is interposed between the magnetic core 20 and the non-magnetic core 30, more particularly between the first portion 23 of magnetic core and the second portion 33 of non-magnetic core.

The magnetic shield element 4 has opposite surfaces in contact respectively with corresponding surfaces of the magnetic core 20 and of the casing 34 of the non-magnetic core 30.

The magnetic shield element 4 has a shape partially matching with the shapes of the first portion 23 of magnetic core and the shape of the second portion 33 of non-magnetic core. More particularly, the magnetic shield element 4 has a ring shape approximately with a same radius of curvature of the first portion 23 of magnetic core and the second portion 33 of non-magnetic core.

The magnetic shield element 4 may be bonded to the magnetic core 20 and to the casing 34 of the non-magnetic core 30. As an alternative, it may be simply sandwiched between the magnetic core 20 and the casing 34 of the non-magnetic core 30. In this case, the magnetic shield element 4 may be kept in position by the outer casing 11 of the accessory device.

EMBODIMENT #2

According to another embodiment of the disclosure (FIGS. 5-7), the accessory device 1 includes a pair of magnetic shield elements 5, 6 interposed between the magnetic core 20 and the non-magnetic core 30, more particularly between the first portion 23 of magnetic core and the second portion 33 of non-magnetic core.

The accessory device 1 includes a first magnetic shield element 5, which is made of non-magnetic material and arranged in proximal position to the magnetic core 20, more particularly to first portion 23 of magnetic core.

The accessory device 1 further includes a second magnetic shield element 6, which is made of magnetic material and arranged in proximal position to the non-magnetic core 30, more particularly to second portion 33 of non-magnetic core.

The first magnetic shield element 5 may be made of plastic or silicone material while the second magnetic shield element 6 may be made of ferromagnetic material.

The magnetic shield elements 5, 6 are conveniently stacked one on another.

The first magnetic shield element 5 has opposite surfaces in contact respectively with corresponding surfaces of the magnetic core 20 and of the second magnetic shield element 6.

The second magnetic shield element 6 has opposite surfaces in contact respectively with corresponding surfaces of the first magnetic shield element 5 and of the second casing 34 of the non-magnetic core 30.

The first and second magnetic shield elements 5, 6 have shapes partially matching with the shapes of the first portion 23 of magnetic core and the shape of the second portion 33 of non-magnetic core 30. More particularly, the first and second magnetic shield elements 5, 6 have ring shapes approximately with a same radius of curvature of the first portion 23 of magnetic core and the second portion 33 of non-magnetic core 30.

The first and second magnetic shield elements 5, 6 may be bonded one to another, to the magnetic core 20 and to the casing 34 of the non-magnetic core 30. As an alternative, they may be simply sandwiched between the magnetic core 20 and the casing 34 of the non-magnetic core 30. In this case, the magnetic shield element 4 may be kept in position by the outer casing 11 of the accessory device.

EMBODIMENT #3

According to another embodiment of the disclosure (FIGS. 8-10), the accessory device 1 includes three magnetic shield elements 7, 8, 9 interposed between the magnetic core 20 and the non-magnetic core 30, more particularly between the first portion 23 of magnetic core and the second portion 33 of non-magnetic core.

The accessory device 1 includes a third magnetic shield element 7 and a fourth magnetic material 8, which are both made of magnetic material and arranged respectively in proximal position to the magnetic core 20, more particularly to first portion 23 of magnetic core, and to the non-magnetic core 30, more particularly to second portion 33 of non-magnetic core.

The accessory device 1 includes a fifth magnetic shield element 9, which is made of non-magnetic material and is interposed between the third and fourth magnetic shield elements 7, 8.

The third and the fourth magnetic shield elements 7, 8 may be made of ferromagnetic material while the fifth magnetic shield element 9 is made of plastic or silicone material.

Conveniently, the magnetic shield elements 7, 8, 9 are stacked one on another.

The third magnetic shield element 7 has opposite surfaces in contact respectively with corresponding surfaces of the magnetic core 20 and of the fifth magnetic shield element 9.

The fourth magnetic shield element 8 has opposite surfaces in contact respectively with corresponding surfaces of the fifth magnetic shield element 9 and of the second casing 34 enclosing the non-magnetic core 30.

The fourth magnetic shield element 9 has opposite surfaces in contact respectively with corresponding surfaces third and fourth magnetic shield elements 7, 8.

The third, fourth, and fifth magnetic shield elements 7, 8, 9 have shapes matching with the shapes of the first portion 23 of magnetic core and the shape of the second portion 33 of non-magnetic core 30. More particularly, the third, fourth, and fifth magnetic shield elements 7, 8, 9 have ring shapes approximately with a same radius of curvature of the first portion 23 of magnetic core and the second portion 33 of non-magnetic core 30.

The third, fourth, and fifth magnetic shield elements 7, 8, 9 may be bonded one to another, to the magnetic core 20 and to the casing 34 of the non- magnetic core 30. As an alternative, they may be simply sandwiched between the magnetic core 20 and the casing 34 of the non-magnetic core 30. In this case, the magnetic shield element 4 may be kept in position by the outer casing 11 of the accessory device.

The accessory device, according to the disclosure, provides remarkable advantages with respect to the known apparatuses of the state of the art.

The arrangement one or more magnetic shield elements 4, 5, 6, 7, 8, 9 between the magnetic core 20 of the power supply arrangement 2 and the current detection arrangement 3 (may be the non-magnetic core 30 of this latter) allows reducing the magnetic flux leaking from the first magnetic circuit 21 and influencing the operation of the current detection arrangement 3, when a current flow along the primary conductor 150.

For example, referring to the embodiments shown in the cited figures, the one or more magnetic shield elements 4, 5, 6, 7, 8, 9 can remarkably reduce the magnetic flux leaking from the first magnetic circuit 21 of the power supply arrangement and directed in such a way to enchain with the second magnetic circuit 31 of the current detection arrangement, when a current flows along the primary winding conductor 150.

The solution provided by the present disclosure allows greatly improving the performances of the current detection arrangement 3 in comparison to traditional solutions of the state of the art.

Figure 11:
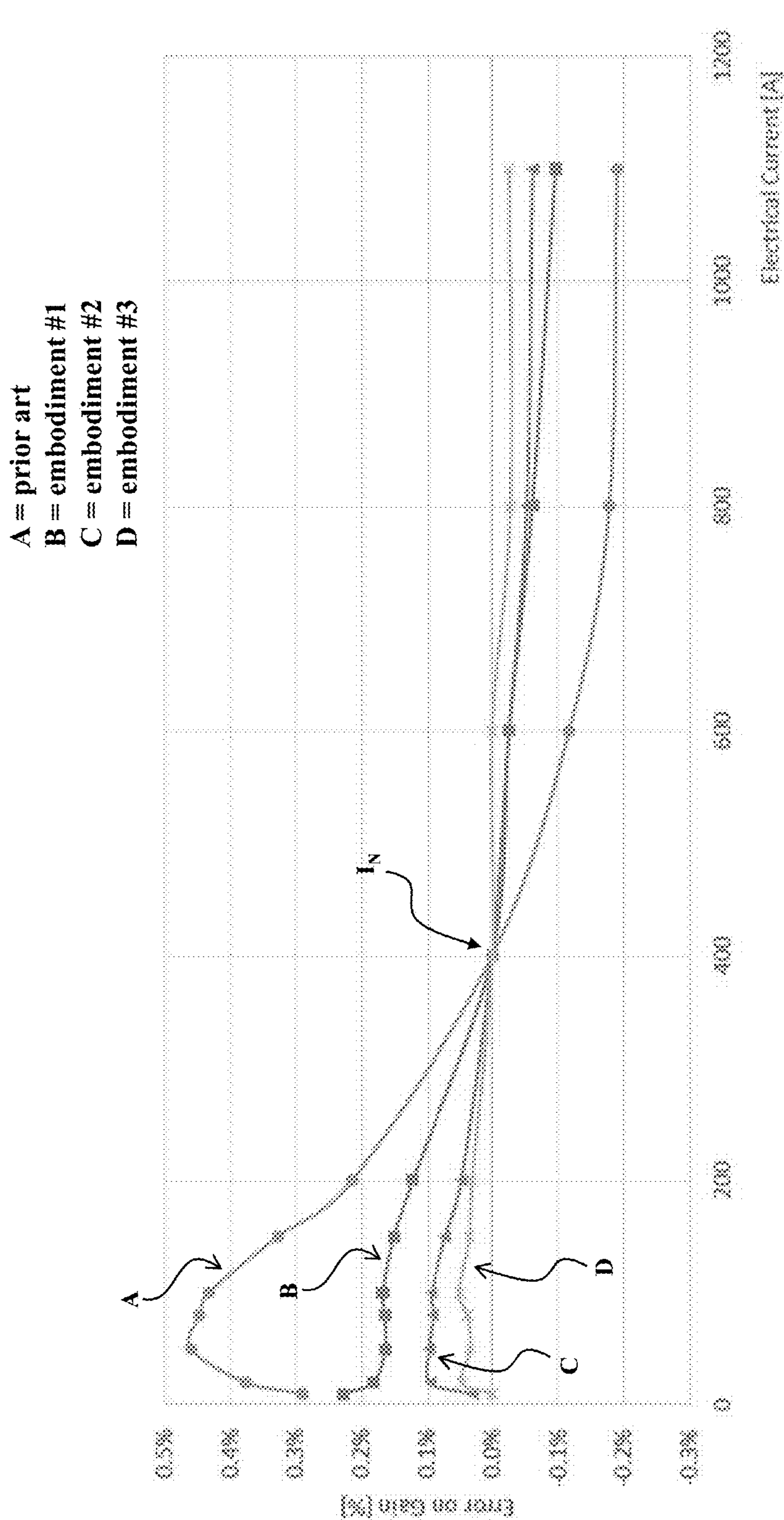
FIG. 11 schematically shows graphs indicative of the accuracy of the current measurements provided by the accessory device of the disclosure (according to each of the above-mentioned embodiments) compared to the current measurements provided by an accessory device of the state of the art.

FIG. 11 shows different error curves for current measurements carried out by an accessory device of the state of the art and by the accessory device of the disclosure, according to the different embodiments described above.

The error curves shown in FIG. 11 are all parametrized for reference current $I_N$=400 A, which is a typical nominal current for industrial circuit breakers.

As it is possible to notice, when realized according to any of the above-mentioned embodiments, the accessory device 1 ensures a noticeable increase of the measurement accuracy with respect to the traditional device, in particular when the measurement currents are far from the nominal current $I_N$.

In the accessory device, the measurement accuracy is quite stable for a wide range of current values. For example, when realized according to the embodiments #2 and #3 described above, the accessory device 1 ensures a measurement accuracy included in the range of [-0,1%, 0,1%] and substantially independent from the current magnitude.

The accessory device, according to the disclosure, has a relatively simple and compact structure and it can be easily incorporated in the overall structure of a low-voltage switch.

The accessory device. according to the disclosure. is relatively easy and cheap to manufacture at industrial level.

What is claimed is:

1. An accessory device for a low-voltage switch, the accessory device comprising:

a power supply arrangement configured to provide a power supply to feed an electronic device onboard the low-voltage switch, the power supply arrangement including a magnetic core, which forms a first magnetic circuit configured to be enchained with a primary winding conductor, and a first secondary winding conductor, which is wound around the magnetic core; and a current detection arrangement configured to provide detection signals indicative of a current flowing along the primary winding conductor, wherein the magnetic core and the current detection arrangement are arranged next to each other, wherein the accessory device comprises magnetic shield elements interposed, at least partially, between the magnetic core and the current detection arrangement, wherein the accessory device comprises a first magnetic shield element and a second magnetic shield element, which are made of a magnetic material and are arranged in proximal position respectively to the magnetic core and to the current detection arrangement, and a third magnetic shield element, which is made of a non-magnetic material and is interposed between the first and second magnetic shield elements, wherein the current detection arrangement includes a non-magnetic core, which forms a second magnetic circuit configured to be enchained with the primary winding conductor, and at least a second secondary winding conductor, which is wound around the non-magnetic core, wherein the magnetic core and the non-magnetic core are arranged next to each other, and wherein the magnetic shield elements are interposed, at least partially, between the magnetic core and the non-magnetic core.

2. The accessory device according to claim 1, wherein:

a first portion of the magnetic core and a second portion of the non-magnetic core are arranged next to each other, and the magnetic shield elements are interposed, at least partially, between the first portion of the magnetic core and the second portion of the non-magnetic core.

3. The accessory device according to claim 1, wherein:

the first and second magnetic shield elements are made of ferromagnetic material, and the third magnetic shield element is made of plastic or silicone material.

4. The accessory device according to according to claim 1, wherein the magnetic shield elements have a ring shape.

5. The accessory device according to according to claim 1, wherein the magnetic shield elements have shapes partially matching with a shape of a first portion of the magnetic core and a shape of a second portion of the non-magnetic core.

6. A low-voltage switch, comprising:

an accessory device, comprising:

a power supply arrangement configured to provide a power supply to feed an electronic device onboard the low-voltage switch, the power supply arrangement including a magnetic core, which forms a first magnetic circuit configured to be enchained with a primary winding conductor, and a first secondary winding conductor, which is wound around the magnetic core; and a current detection arrangement configured to provide detection signals indicative of a current flowing along the primary winding conductor, wherein the magnetic core and the current detection arrangement are arranged next to each other, wherein the accessory device comprises magnetic shield elements interposed, at least partially, between the magnetic core and the current detection arrangement, and wherein the accessory device comprises a first magnetic shield element and a second magnetic shield element, which are made of a magnetic material and are arranged in proximal position respectively to the magnetic core and to the current detection arrangement, and a third magnetic shield element, which is made of a non-magnetic material and is interposed between the first and second magnetic shield elements, wherein the current detection arrangement includes a non-magnetic core, which forms a second magnetic circuit configured to be enchained with the primary winding conductor, and at least a second secondary winding conductor, which is wound around the non-magnetic core, wherein the magnetic core and the non-magnetic core are arranged next to each other, and wherein the magnetic shield elements are interposed, at least partially, between the magnetic core and the non-magnetic core.

7. The low-voltage switch according to claim 6, wherein:

a first portion of the magnetic core and a second portion of the non-magnetic core are arranged next to each other, and the magnetic shield elements are interposed, at least partially, between the first portion of the magnetic core and the second portion of the non-magnetic core.

8. The low-voltage switch according to claim 6, wherein:

the first and second magnetic shield elements are made of ferromagnetic material; and the third magnetic shield element is made of plastic or silicone material.

9. The low-voltage switch according to according to claim 6, wherein the magnetic shield elements have a ring shape.

10. The low-voltage switch according to claim 6, wherein the magnetic shield elements have shapes partially matching with a shape of a first portion of the magnetic core and a shape of a second portion of the non-magnetic core.

* * * * *